(12) United States Patent
Lee et al.

(10) Patent No.: US 8,186,043 B2
(45) Date of Patent: May 29, 2012

(54) METHOD OF MANUFACTURING A CIRCUIT BOARD

(75) Inventors: Sang-min Lee, Changwon (KR); Deok-heung Kim, Changwon (KR); Doc-hwa Na, Changwon (KR)

(73) Assignee: Samsung Techwin Co., Ltd., Changwon (KR)

( * ) Notice: Subject to any disclaimer, the term of this patent is extended or adjusted under 35 U.S.C. 154(b) by 0 days.

(21) Appl. No.: 12/891,176

(22) Filed: Sep. 27, 2010

(65) Prior Publication Data

US 2011/0132651 A1    Jun. 9, 2011

(30) Foreign Application Priority Data

Dec. 7, 2009  (KR) .......................... 10-2009-0120716

(51) Int. Cl.
 *H05K 3/36*      (2006.01)

(52) U.S. Cl. ................ 29/830; 29/842; 29/843; 29/846; 438/108; 438/110

(58) Field of Classification Search .................... 29/842, 29/843, 846, 830; 438/108, 110
See application file for complete search history.

(56) References Cited

U.S. PATENT DOCUMENTS

| | | | |
|---|---|---|---|
| 6,204,453 B1 * | 3/2001 | Fallon et al. | 174/255 |
| 6,750,405 B1 * | 6/2004 | Fallon et al. | 174/262 |
| 7,353,590 B2 * | 4/2008 | Fallon et al. | 29/830 |
| 7,511,518 B2 * | 3/2009 | Egitto et al. | 324/754.18 |

* cited by examiner

*Primary Examiner* — Carl Arbes
(74) *Attorney, Agent, or Firm* — Sughrue Mion, PLLC

(57) ABSTRACT

A circuit board and a method of manufacturing the circuit board are provided. The method includes forming at least one protruded bump on a first side of a conductive board, forming a dielectric layer on the first side of the conductive board where the at least one bump is formed so as to cover the at least one bump; and etching a second side of the conductive board so as to partially remove the board to form a pattern.

15 Claims, 11 Drawing Sheets

METHOD OF MANUFACTURING A CIRCUIT BOARD

CROSS-REFERENCE TO RELATED PATENT APPLICATIONS

This application claims priority from Korean Patent Application No. 10-2009-0120716, filed on Dec. 7, 2009, the disclosure of which is incorporated herein in its entirety by reference.

BACKGROUND

1. Field

Methods and apparatuses consistent with the present inventive concept relate to a circuit board and manufacturing the circuit board, and more particularly, to a circuit board including bumps through which layers can be connected without using via holes to be formed by drilling, and a method of manufacturing the circuit board.

2. Description of the Related Art

As nowadays customers require multifunctional products, the size of electronic components included in a product has to be reduced in order to increase the number of electronic components mounted on a circuit board.

A multi-layer circuit board of an electronic device includes a plurality of stacked boards on which electronic components are mounted. Such a multi-layer circuit board can perform more complex electric functions as compared with a single-sided board or a double-sided board, and electronic components can be densely mounted on the multi-layer circuit board. Therefore, multi-layer circuit boards are widely used for various electronic devices.

For example, a multi-layer circuit board is fabricated by forming interconnections on each board for electric connection between components, stacking a plurality of boards, drilling via holes for electrically connecting layers of the boards, and plating the via holes or filling the via holes with a conductive paste.

However, since via-hole drilling is a troublesome process requiring many steps, the via-hole drilling increases manufacturing costs. Furthermore, due to multifunctional semiconductor components having more signal inputs and outputs, more complex circuits are used, and thus, a greater number of fine via holes are necessary. As a result, manufacturing costs and time increase largely due to machining of via holes.

SUMMARY

One or more exemplary embodiments provide a multi-layer circuit board and a method of manufacturing the multi-layer circuit board.

One of more exemplary embodiments provide a multi-layer circuit board formed with a small pitch, and a method of manufacturing the multi-layer circuit board.

One or more exemplary embodiments provide a circuit board without via holes, and a method of manufacturing the circuit board.

According to an exemplary embodiment, there is provided a method of manufacturing a circuit board. The method may include: forming at least one protruded bump on a first side of a conductive board; forming a dielectric layer on the first side of the conductive board where the at least one bump is formed so as to cover the at least one bump; and etching a second side of the conductive board so as to remove at least one portion of the conductive board to form a first pattern corresponding to the at least one bump.

The forming the protruded bump may include: applying photoresist to the first side of the conductive board; exposing and developing the first side of the conductive board, on which the photoresist is applied, to remove at least one portion of the photoresist to form at least one preliminary pattern, corresponding to the at least one bump; and half-etching the first side of the conductive board at least one area where the at least one portion of the photoresist is removed.

The forming the at least one bump may be performed by pressing the conductive board using a die or a roller having the first pattern corresponding to the at least one bump.

The method may further include: removing at least one portion of the dielectric layer to expose the at least one bump; forming a seed layer on the dielectric layer so that the seed layer is connected to the at least one bump; and forming a plating layer having a second pattern on the seed layer.

The forming the plating layer may: forming at least one preliminary pattern on the seed layer by using photoresist; forming the plating layer on the seed layer using the preliminary pattern; removing the photoresist; and removing the seed layer on at least one area where the plating layer is not formed.

The method may further include: forming at least one slot on the dielectric layer by removing at least one portion of the dielectric layer through a laser direct ablation method so that the at least one bump is exposed through the at least one slot; and forming a circuit layer on the at least one slot of the dielectric layer so that the circuit layer is connected to the bump.

The forming the circuit layer may include: plating a conductive layer on the dielectric layer where the at least one slot is formed so as to cover the dielectric layer; and after the conductive layer is formed, removing a part of the conductive layer located outside the dielectric layer by half-etching the conductive layer, wherein the conductive layer from which the part located outside the dielectric layer is removed forms the circuit layer.

According to an exemplary embodiment, there is provided a method of manufacturing a circuit board. The method may include: forming first bumps on a first side of a conductive board and second bumps on a second side of the conductive board; forming a first dielectric layer on the first side of the conductive board to cover the first bumps; forming first photoresist on the second side of the conductive board; forming first preliminary patterns by exposing and developing the first photoresist; and etching the second side of the conductive board to remove portions the conductive board to form a first pattern.

According to an exemplary embodiment, there is provided a circuit board including: a first circuit layer including a pattern, a first bump formed in one piece with the pattern and protruding from a first side of the pattern, and a second bump formed in one piece with the pattern and protruding from a second side of the pattern; a first dielectric layer covering the first side of the pattern in a state where the first bump is exposed through the first dielectric layer; a second circuit layer formed on the first dielectric layer so that the second circuit layer is connected to the first bump; a second dielectric layer covering the second side of the pattern in a state where the second bump is exposed through the second dielectric layer; and a third circuit layer formed on the second dielectric layer so that the third circuit layer is connected to the second bump.

The second circuit layer may include a seed layer making contact with the first dielectric layer and a first plating layer formed on the seed layer, and the third circuit layer may comprise a seed layer making contact with the second dielectric layer and a second plating layer formed on the seed layer.

The circuit board may further include passivation layers formed on the second and third circuit layers, respectively.

According to an exemplary embodiment, there is provided a circuit board including: a circuit layer including a pattern and a bump, the bump being formed in one piece with the pattern and protruding from one side of the pattern; and a dielectric layer covering the one side of the pattern in a state where the bump is exposed through the dielectric layer.

The circuit board may further include a second dielectric layer covering the other side of the pattern in a state where a part of the pattern is exposed through the second dielectric layer.

BRIEF DESCRIPTION OF THE DRAWINGS

The above and other aspects of the present inventive concept will become more apparent by describing in detail exemplary embodiments thereof with reference to the attached drawings in which.

DETAILED DESCRIPTION OF EXEMPLARY EMBODIMENTS

A circuit board and a method of manufacturing the circuit board will now be described in detail with reference to the accompanying drawings, in which exemplary embodiments are shown.

Figure 1:
FIG. 1 is a sectional view of a board for explaining a method of manufacturing a circuit board according to an exemplary embodiment.
Figure 2:
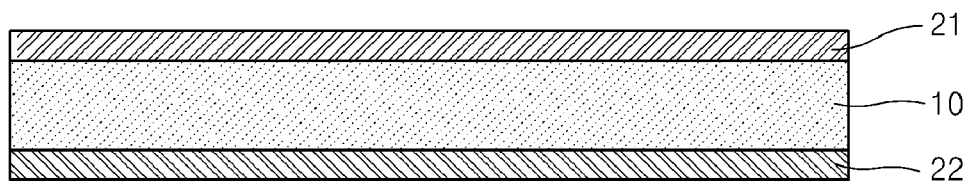
FIG. 2 is a sectional view illustrating the board of FIG. 1 after a photoresist is applied on the board according to an exemplary embodiment.

FIG. 1 is a sectional view of a board 10 for explaining a method of manufacturing a circuit board according to an exemplary embodiment; FIG. 2 is a sectional view illustrating the board 10 after photoresists 21 and 22 are applied to the board 10 according to an exemplary embodiment; and FIG. 3 is a sectional view illustrating the photoresists 21 and 22 of FIG. 2 after some parts thereof are removed according to an exemplary embodiment.

The board 10 is a part of a multi-layer circuit board on which patterns will be formed to transmit electric signals. The board 10 may include an electrically conductive material such as copper (Cu) or silver (Ag).

The board 10 has a plate shape, and a section taken in the thickness direction of the board 10 is shown in the drawings. In the following description of a method of manufacturing a circuit board, the board 10 and other raw materials are considered as being wound around a reel, and processes such as an etching process and a coating process are performed on the board 10 while the board 10 is unwound from the reel by rotating the reel.

Figure 3:
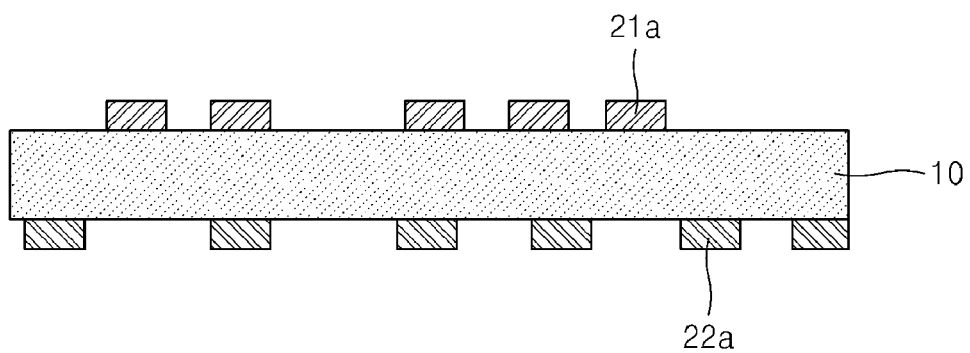
FIG. 3 is a sectional view illustrating the photoresist of FIG. 2 after some parts of the photoresist are removed according to an exemplary embodiment.

Processes of forming preliminary patterns for forming bumps on the surfaces of the board 10 are illustrated in FIGS. 1 through 3. The photoresists 21 and 22 are applied to both sides of the board 10. Properties of the photoresists 21 and 22 change when exposed to light, and parts of the photoresist 21 and 22 exposed to light may be removed by using a developer. The photoresists 21 and 22 are exposed to light (an exposing process) when masks are placed on the surfaces of the photoresists 21 and 22, and then the photoresists 21 and 22 are developed for removing parts thereof and forming preliminary patterns 21a and 22a as shown in FIG. 3. The preliminary patterns 21a and 22a are formed at positions of the board 10 where bumps will be formed.

Figure 4:
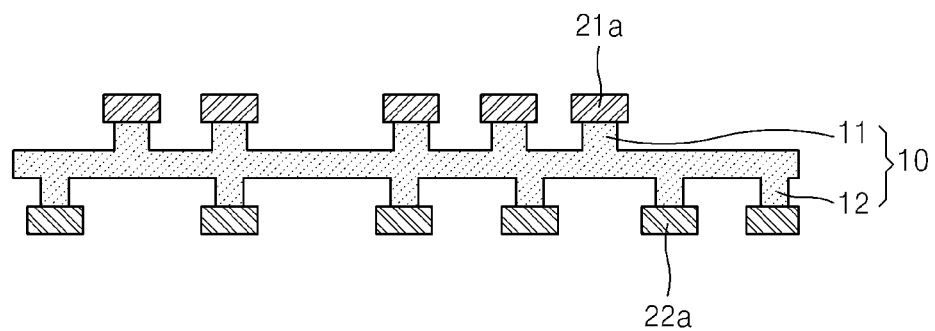
FIG. 4 is a sectional view illustrating the board of FIG. 3 after a half etching process is performed according to an exemplary embodiment.
Figure 5:
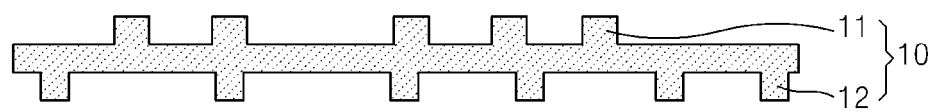
FIG. 5 is a sectional view illustrating the board of FIG. 4 after the photoresist is removed from the board according to an exemplary embodiment.

FIG. 4 is a sectional view illustrating the board 10 after a half etching process is performed according to an exemplary embodiment, and FIG. 5 is a sectional view illustrating the board 10 after the photoresists 21 and 22 are removed from the board 10 according to an exemplary embodiment.

The half etching process is a relative term with respect to the term "full etching process" whereby a board is removed to form through holes. That is, in a half etching process, a portion thickness of the board is removed by controlling the etching process.

When a half etching process is performed on the board 10, parts of the board 10 where the preliminary patterns 21a and 22a are not formed are removed by an etchant, and thus first and second bumps 11 and 12 are formed at positions corresponding to the preliminary patterns 21a and 22a as shown in FIG. 4. In the exemplary embodiment shown in FIG. 4, the first and second bumps 11 and 12 are formed at both sides of the board 10. After the first and second bumps 11 and 12 are formed, the preliminary patterns 21a and 22a are removed.

Figure 6:
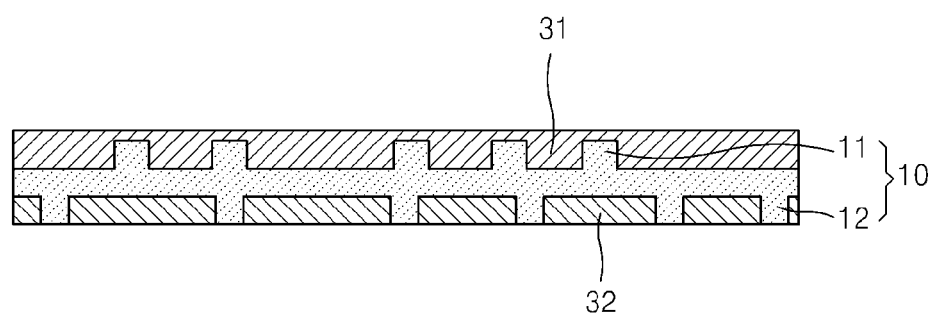
FIG. 6 is a sectional view illustrating the board of FIG. 5 after a dielectric layer and photoresist are coated on the board according to an exemplary embodiment.
Figure 7:
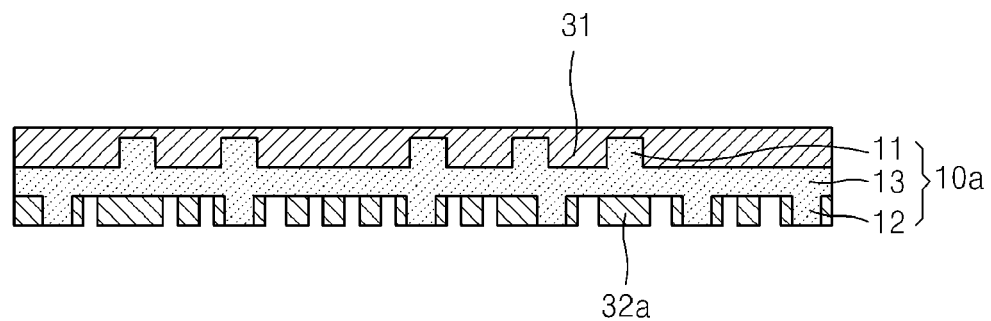
FIG. 7 is a sectional view illustrating the board of FIG. 6 after some parts of the photoresist are removed according to an exemplary embodiment.
Figure 8:
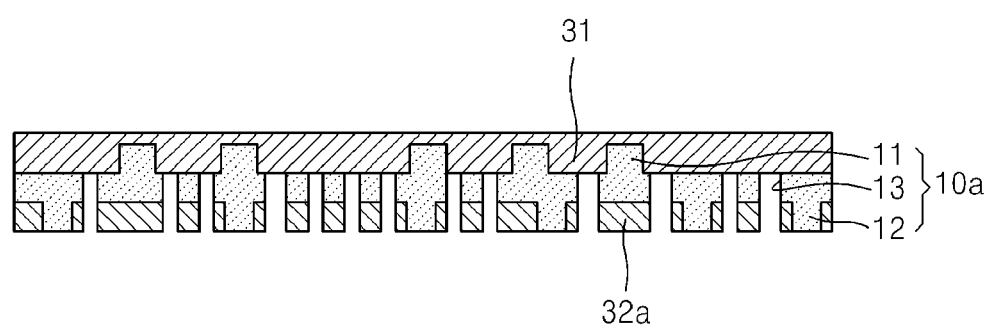
FIG. 8 is a sectional view illustrating the board of FIG. 7 after an etching process is performed according to an exemplary embodiment.
Figure 9:
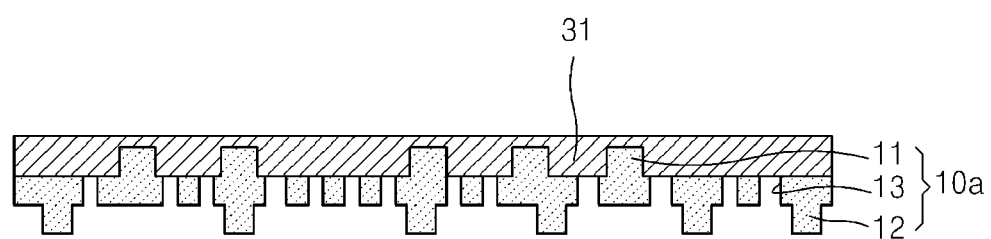
FIG. 9 is a sectional view illustrating the board of FIG. 8 after the photoresist is removed from the board according to an exemplary embodiment.

FIG. 6 is a sectional view illustrating the board 10 after a first dielectric layer 31 and a photoresist 32 are coated on the board 10 according to an exemplary embodiment; FIG. 7 is a sectional view illustrating the board 10 after some parts of the photoresist 32 are removed according to an exemplary embodiment; FIG. 8 is a sectional view illustrating the board 10 after an etching process is performed according to an exemplary embodiment; and FIG. 9 is a sectional view illustrating the board 10 after the photoresist 32 is removed from the board 10 according to an exemplary embodiment.

FIG. 6 illustrates a process of forming the first dielectric layer 31 on a side of the board 10 where the first bumps 11 are formed. The first dielectric layer 31 includes an electrical insulator material and functions as a supporting structure for the board 10. The first dielectric layer 31 covers the first bumps 11 so that the board 10 can be protected during a later etching process.

As shown in FIG. 6, the photoresist 32 is applied to the other side of the board 10 where the second bumps 12 are formed, and exposing and developing processes are performed using a mask so as to remove some parts of the photoresist 32 for forming a preliminary pattern 32a corresponding to a pattern to be formed on the board 10.

An etching process is performed by allowing an etchant to flow along slots of the preliminary pattern 32a so as to form a first circuit layer 10a as shown in FIG. 8. The first circuit layer 10a includes a pattern 13 formed by patterning the board 10, the first bumps 11 formed in one piece with the pattern 13 and protruding from one side of the pattern 13, and the second bumps 12 formed in one piece with the pattern 13 and protruding from the other side of the pattern 13. Since the pattern 13, the first bumps 11, and the second bumps 12 of the first circuit layer 10a are formed in one piece, circuit layers located at both sides of the first circuit layer 10a can be connected without having to form via holes, and thus a multi-layer circuit board can be easily fabricated.

The circuit board manufacturing method of the present inventive concept is not limited to the above-described bump forming process. For example, instead of using a half etching process, bumps may be formed by pressing the board 10 with a die or roller having a pattern corresponding to the bumps.

Figure 10:
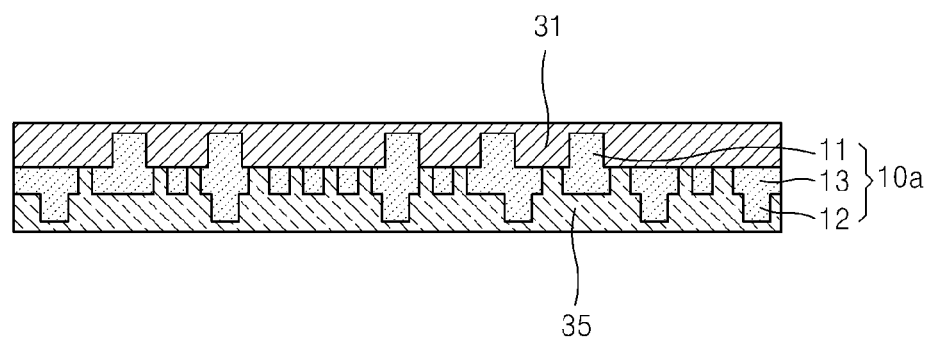
FIG. 10 is a sectional view illustrating the board of FIG. 9 after a dielectric layer is coated on the board according to an exemplary embodiment.
Figure 11:
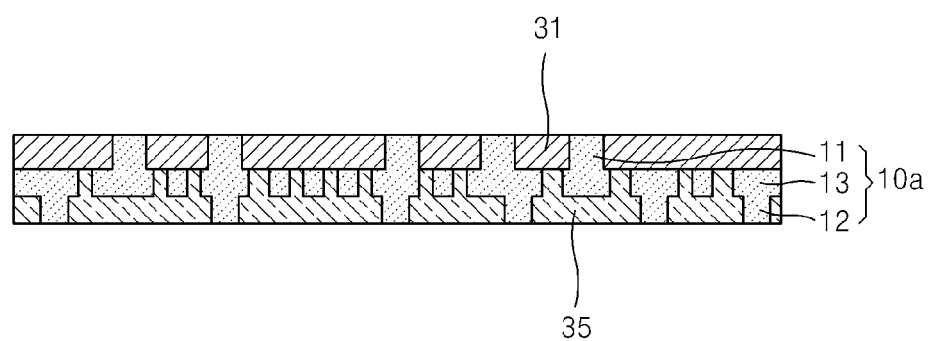
FIG. 11 is a sectional view illustrating the board of FIG. 10 after the dielectric layer is partially removed according to an exemplary embodiment.

FIG. 10 is a sectional view illustrating the board 10 after a second dielectric layer 35 is coated on the board according to an exemplary embodiment, and FIG. 11 is a sectional view illustrating the board 10 after the second dielectric layer 35 is partially removed according to an exemplary embodiment.

After the pattern 13 is formed by an etching process, the preliminary pattern 32a is removed, and then the second dielectric layer 35 is coated on the other side of the first circuit layer 10a to cover the second bumps 12.

Thereafter, the first and second dielectric layers 31 and 35 that cover both sides of the first circuit layer 10a may be partially removed to expose the first and second bumps 11 and 12. The first and second dielectric layers 31 and 35 may be partially removed through a scrubbing process using plasma or a wet desmear process using a special chemical.

Figure 12:
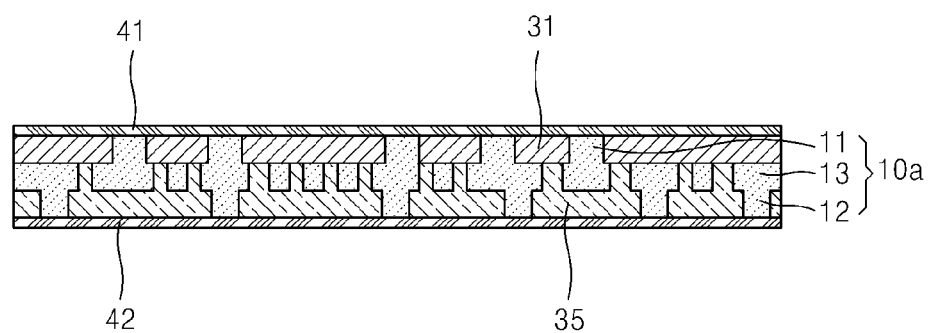
FIG. 12 is a sectional view illustrating the board of FIG. 11 after seed layers are formed according to an exemplary embodiment.

FIG. 12 is a sectional view illustrating the board 10 after seed layers 41 and 42 are formed according to an exemplary embodiment.

After the first and second bumps 11 and 12 are exposed, the seed layers 41 and 42 which are connected to the first and second bumps 11 and 12 may be formed by a plating method. The seed layers 41 and 42 may be formed by an electroless plating method using an electrically conductive metal such as copper.

The circuit board manufacturing method is not limited to the above-described seed layer forming method. For example, instead of using an electroless plating method, seed layers may be formed through a bonding process by pressing copper foils to the first and second dielectric layers 31 and 35 at a high pressure and temperature. For example, the bonding process may be performed at about 210° C. with a pressure of about 90 kgf/cm².

Figure 13:
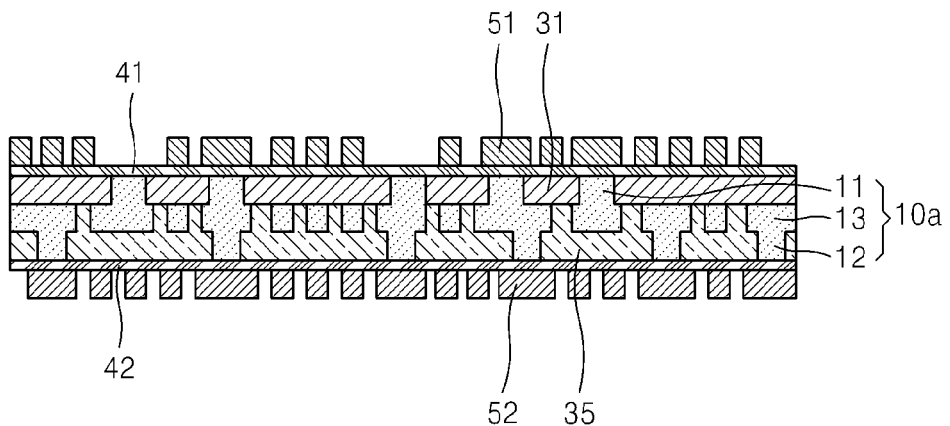
FIG. 13 is a sectional view illustrating the board of FIG. 12 after preliminary patterns are formed on the seed layers by using a photoresist according to an exemplary embodiment.
Figure 14:
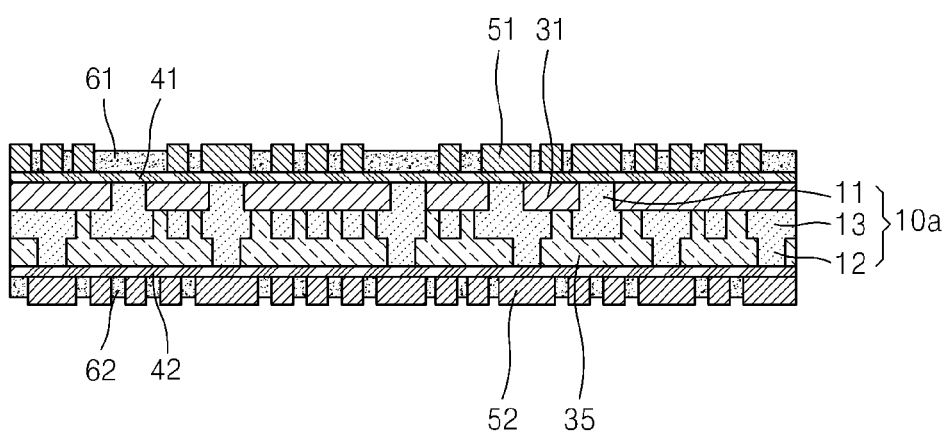
FIG. 14 is a sectional view illustrating the board of FIG. 13 after plating layers are formed on the seed layers according to an exemplary embodiment.

FIG. 13 is a sectional view illustrating the board 10 after preliminary patterns 51 and 52 are formed on the seed layers 41 and 42 by using a photoresist according to an exemplary embodiment, and FIG. 14 is a sectional view illustrating the board 10 after plating layers 61 and 62 are formed on the seed layers 41 and 42 according to an exemplary embodiment.

After the seed layers 41 and 42 are formed, the preliminary patterns 51 and 52 may be formed on the surfaces of the seed layers 41 and 42 by using photoresist. The preliminary patterns 51 and 52 may be negative patterns having shapes opposite to the shapes of patterns to be finally formed. The preliminary patterns 51 and 52 may be formed through exposing and developing processes using masks.

After the preliminary patterns 51 and 52 are formed, the plating layers 61 and 62 may be formed. The plating layers 61 and 62 may be attached to the surfaces of the seed layers 41 and 42 through slots in the preliminary patterns 51 and 52.

Since the seed layers 41 and 42 occupy the entire surface area of the first circuit layer 10a, the plating layers 61 and 62 may be formed by an electro-plating or electroless plating method.

Figure 15:
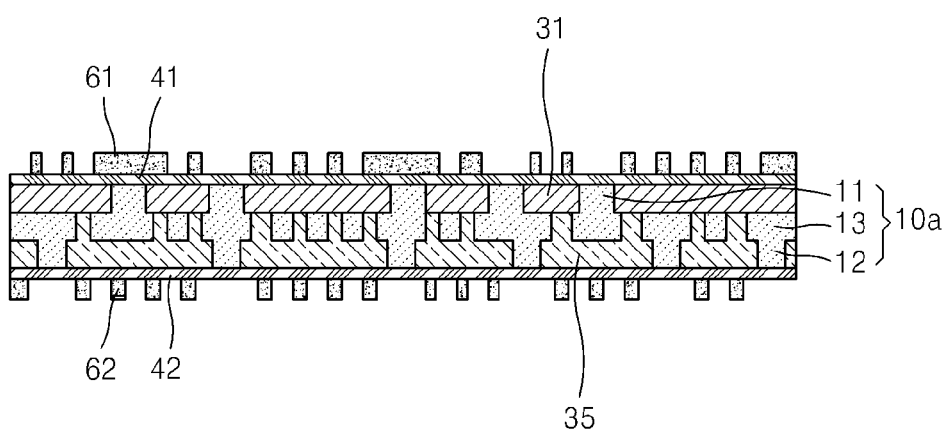
FIG. 15 is a sectional view illustrating the board of FIG. 14 after the photoresist is removed from the board according to an exemplary embodiment.
Figure 16:
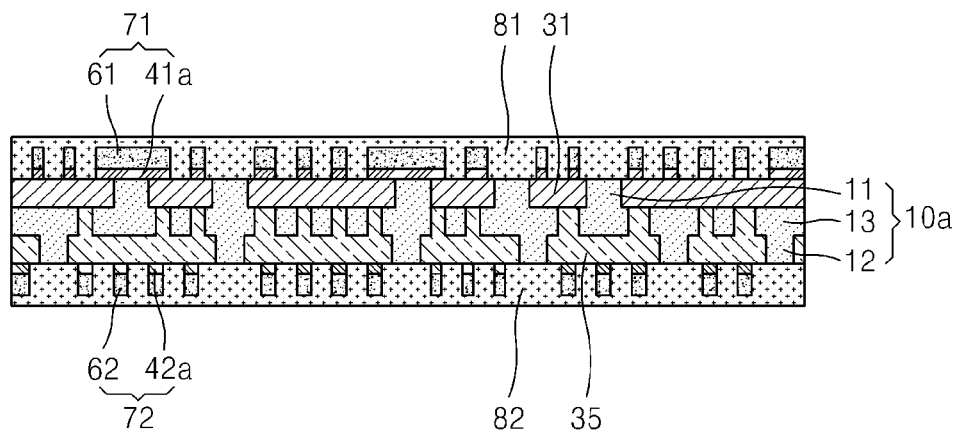
FIG. 16 is a sectional view illustrating the board of FIG. 15 after passivation layers are formed according to an exemplary embodiment.

FIG. 15 is a sectional view illustrating the board 10 after the photoresist is removed from the board 10 according to an exemplary embodiment, and FIG. 16 is a sectional view illustrating the board 10 after passivation layers 81 and 82 are formed according to an exemplary embodiment.

After the plating layers 61 and 62 are formed, the preliminary patterns 51 and 52 are removed, and a half etching process is performed. In the half etching process, parts of the thin seed layers 41 and 42 exposed through slots in the plating layers 61 and 62 are first removed so that seed layers 41a and 42a having the same patterns as those of the plating layers 61 and 62 can be formed.

As a result, a second circuit layer 71 is formed on a side of the first circuit layer 10a. The second circuit layer 71 includes the seed layer 41a connected to the first bumps 11, and the plating layer 61. The second circuit layer 71 is formed on the first dielectric layer 31.

A third circuit layer 72 is formed on the other side of the first circuit layer 10a. The third circuit layer 72 includes the seed layer 42a connected to the second bumps 12, and the plating layer 62. The third circuit layer 72 is formed on the second dielectric layer 35.

The passivation layers 81 and 82 may be formed on the second circuit layer 71 and the third circuit layer 72, respectively, so as to prevent a circuit short caused by corrosion or scratching.

According to the above-described method of manufacturing a circuit board, layers can be connected to each other through bumps without having to perform a drilling process for forming via holes, and thus the manufacturing processes can be simply performed with lower costs and in a shorter time. In addition, since bumps formed by a half etching process are used to connect layers, fine pitch circuits can be formed.

Since related art multi-layer circuit boards include core layers for forming via holes and connecting layers through the via holes, the related art multi-layer circuit boards are thick. However, according to the circuit board manufacturing method of the exemplary embodiments, since the first circuit layer including patterns and bumps that are formed in one piece is used to connect layers while the first circuit layer functions as a circuit, a multi-layer circuit board not including a core layer can be manufactured.

Figure 17:
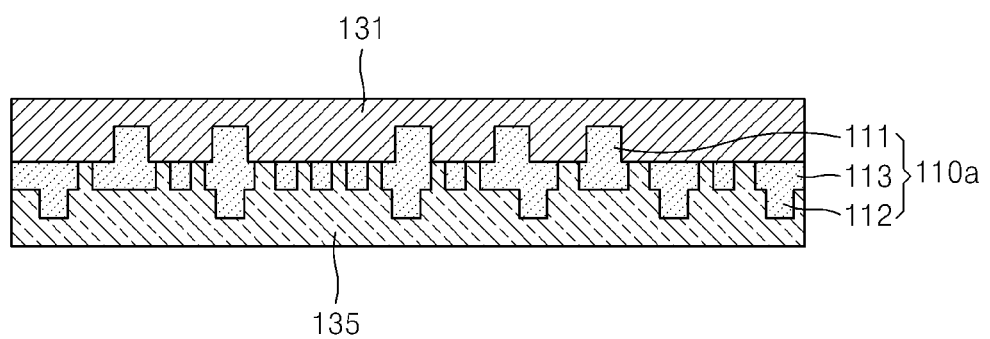
FIG. 17 is a sectional view illustrating a state where dielectric layers are coated on both sides of a board where bumps and a pattern are formed in a method of manufacturing a circuit board according to an exemplary embodiment.
Figure 18:
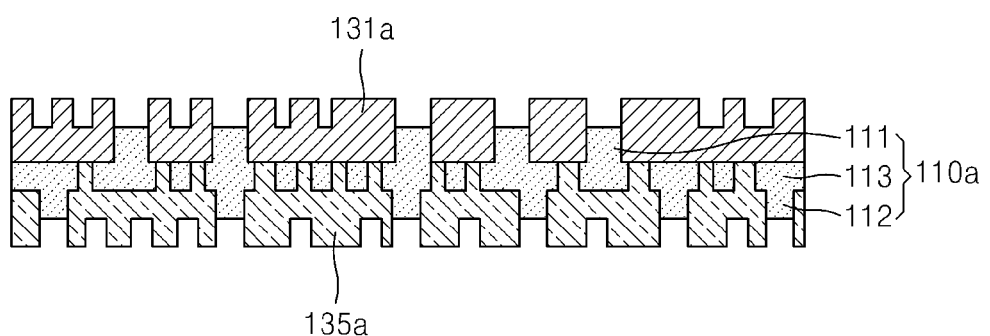
FIG. 18 is a sectional view illustrating the board of FIG. 17 after the dielectric layers are partially removed according to an exemplary embodiment.

FIG. 17 is a sectional view illustrating a state where first and second dielectric layers 131 and 135 are coated on both sides of a board where first and second bumps 111 and 112 and a pattern 113 are formed in a method of manufacturing a circuit board according to an exemplary embodiment, and FIG. 18 is a sectional view illustrating the board of FIG. 17 after the first and second dielectric layers 131 and 135 are partially removed according to an exemplary embodiment.

FIG. 17 illustrates a first circuit layer 110a fabricated through the same processes as those illustrated in the exemplary embodiments of FIGS. 1 through 10. The first circuit layer 110a corresponds to the first circuit layer 10a as shown in FIG. 10. The first circuit layer 110a includes the pattern 113, the first bumps 111 protruding from one side of the pattern 113, and the second bumps 112 protruding from the other side of the pattern 113. The first dielectric layer 131 is coated on one side of the first circuit board 110a, and the second dielectric layer 135 is coated on the other side of the first circuit board 110a.

In the exemplary embodiments shown in FIGS. 17 through 21, a second circuit layer and a third circuit layer are formed on both sides of the first circuit board 110a by a modified method.

Exposing and developing processes are performed using a mask so as to remove parts of the first and second dielectric layers 131 and 135 for forming dielectric layers 131a and 135a having preliminary patterns. The preliminary patterns of the dielectric layers 131a and 135a include slots through which the first and second bumps 111 and 112 are exposed.

After the first and second bumps 111 and 112 are exposed, conductive layers 141 and 142 connected to the first and second bumps 111 and 112 may be formed by a plating method. The conductive layers 141 and 142 may be formed by an electroless plating method using an electrically conductive metal such as copper.

Figure 19:
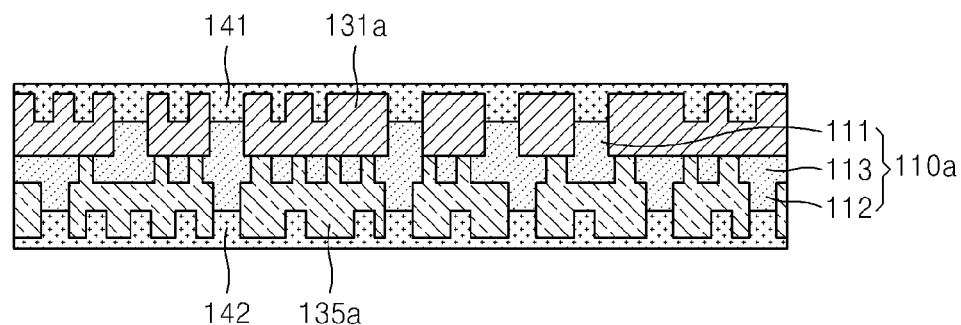
FIG. 19 is a sectional view illustrating the board of FIG. 18 after conductive layers are formed on the board according to an exemplary embodiment.
Figure 20:
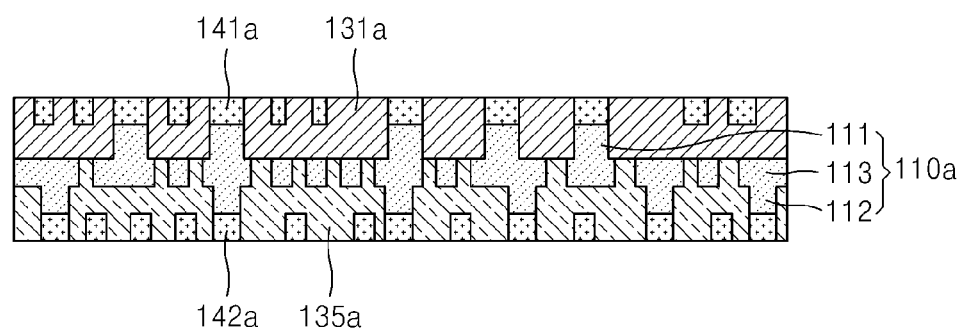
FIG. 20 is a sectional view illustrating the board of FIG. 19 after a half etching process is performed on the board according to an exemplary embodiment.

FIG. 19 is a sectional view illustrating the board of FIG. 18 after the conductive layers 141 and 142 are formed on the board according to an exemplary embodiment, and FIG. 20 is a sectional view illustrating the board of FIG. 19 after a half etching process is performed on the board.

After the conductive layers 141 and 142 are formed, a half etching process is performed to partially remove the outermost conductive layers 141 and 142. That is, parts of the conductive layers 141 and 142 located outside the dielectric layers 131a and 135a are removed.

After the half etching process, as shown in FIG. 20, a second circuit layer 141a is formed on a side of the first circuit board 110a. The second circuit layer 141a is connected to the first bumps 111. A third circuit layer 142a is formed on the other side of the first circuit board 110a. The third circuit layer 142a is connected to the second bumps 112.

Figure 21:
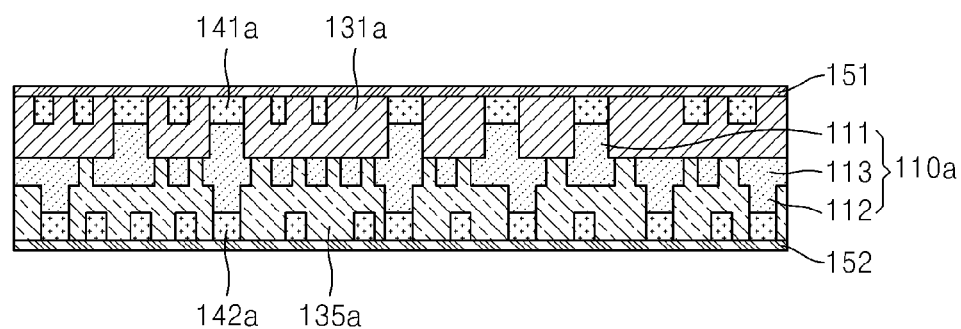
FIG. 21 is a section view illustrating the board of FIG. 20 after passivation layers are formed on the board according to an exemplary embodiment.

FIG. 21 is a section view illustrating the board of FIG. 20 after passivation layers 151 and 152 are formed on the board according to an exemplary embodiment.

The passivation layers 151 and 152 are formed on the surfaces of the second and third circuit layers 141a and 142a so as to prevent a short circuit caused by corrosion or scratching.

Figure 22:
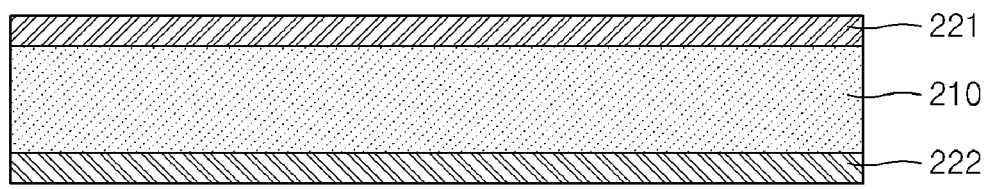
FIG. 22 is a sectional view illustrating a board coated with photoresist in a method of manufacturing a circuit board according to an exemplary embodiment.
Figure 23:
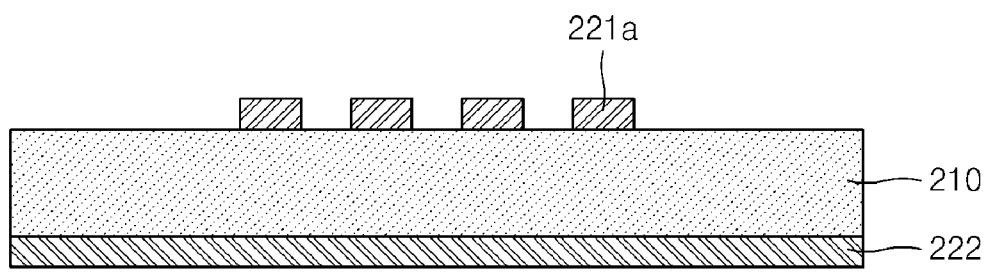
FIG. 23 is a sectional view illustrating the board of FIG. 22 after a preliminary pattern is formed using the photoresist according to an exemplary embodiment.
Figure 24:
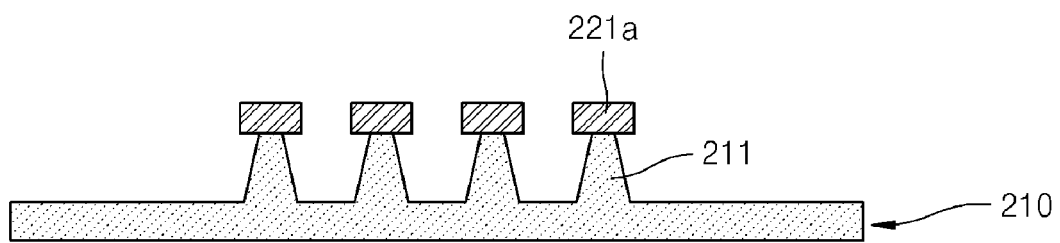
FIG. 24 is a sectional view illustrating the board of FIG. 23 after a half etching process is performed on the board according to an exemplary embodiment.
Figure 25:
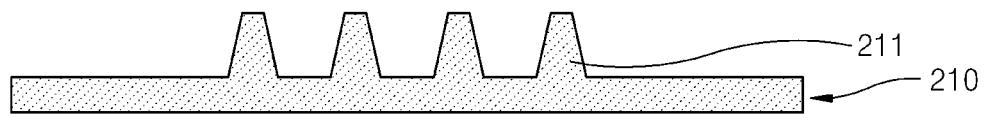
FIG. 25 is a sectional view illustrating the board of FIG. 24 after the photoresist is removed from the board according to an exemplary embodiment.

FIG. 22 is a sectional view illustrating a board 210 coated with photoresist 221 and 222 in a method of manufacturing a circuit board according to an exemplary embodiment; FIG. 23 is a sectional view illustrating the board 210 after a preliminary pattern 221a is formed using the photoresist 221 according to an exemplary embodiment; FIG. 24 is a sectional view illustrating the board 210 after a half etching process is performed on the board 210 according to an exemplary embodiment; and FIG. 25 is a sectional view illustrating the board 210 after the preliminary pattern 221a is removed from the board according to an exemplary embodiment.

The exemplary embodiments of FIGS. 22 to 31 refer to a circuit board including bumps formed in one piece with the circuit board.

Processes shown in FIGS. 22 through 25 are similar to the processes shown in FIGS. 1 to 5. Processes for forming bumps on a board are shown in FIGS. 22 to 25.

After the photoresist 221 and 222 is applied to both sides of the board 210, exposing and developing processes are performed using a mask so as to remove parts of the photoresist 221 formed on one side of the board 210 for forming the preliminary pattern 221a as shown in FIG. 23. The preliminary pattern 221a is formed at positions where bumps will be formed on the board 210.

A half etching process is performed on the board 210 so as to remove parts of the board 210 not covered with the preliminary pattern 221a by using an etchant, for forming bumps 211 corresponding to the preliminary pattern 221a as shown in FIG. 24. In the current exemplary embodiment, the bumps 211 are formed only on one side of the board 210. After the bumps 211 are formed, the preliminary pattern 221a is removed.

Figure 26:
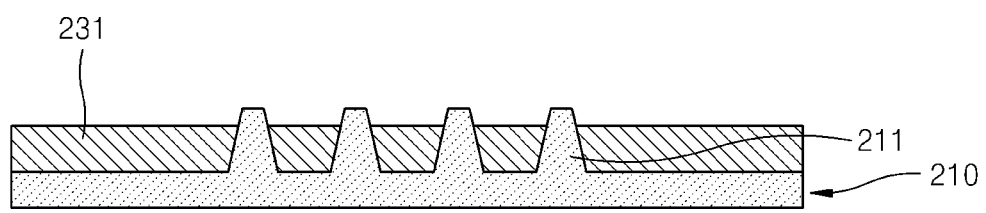
FIG. 26 is a sectional view illustrating the board of FIG. 25 after a dielectric layer is coated on the board according to an exemplary embodiment.
Figure 27:
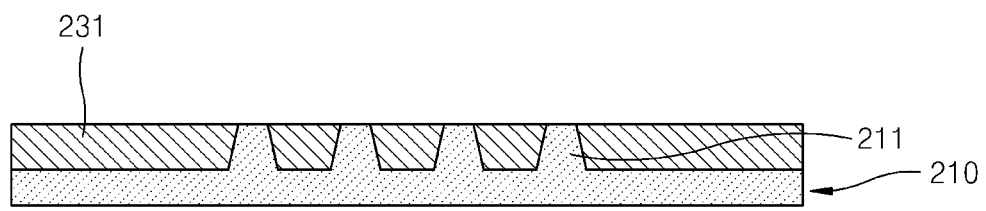
FIG. 27 is a sectional view illustrating the board of FIG. 26 after bumps are partially removed according to an exemplary embodiment.

FIG. 26 is a sectional view illustrating the board 210 after a dielectric layer 231 is coated on the board according to an exemplary embodiment, and FIG. 27 is a sectional view illustrating the board 210 after the bumps 211 are partially removed according to an exemplary embodiment.

FIG. 26 illustrates a process of forming a dielectric layer 231 on one side of the board 210 where the bumps 211 are formed. The dielectric layer 231 includes an electrical insulator material and functions as a supporting structure for the board 210. The dielectric layer 231 covers the board 210 in a manner such that ends of the bumps 211 are protruded from the dielectric layer 231. After the dielectric layer 231 is coated, the protruded ends of the bumps 211 are removed.

Figure 28:
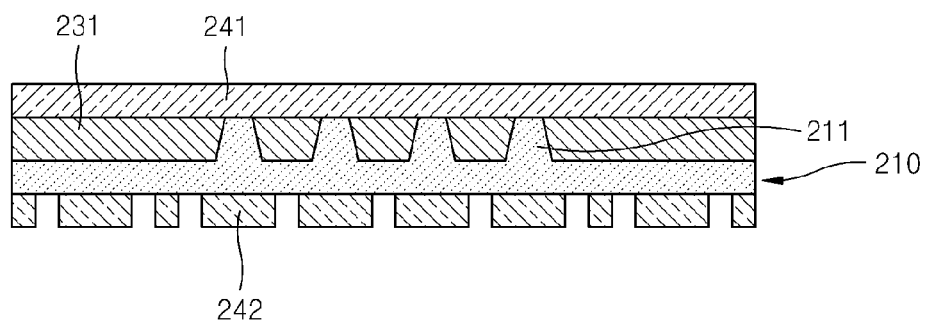
FIG. 28 is a sectional view illustrating the board of FIG. 28 after a photoresist is applied to the board and a preliminary pattern is formed according to an exemplary embodiment.
Figure 29:
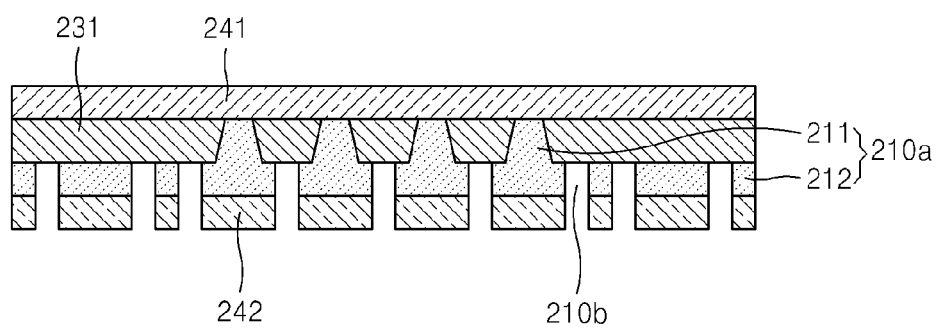
FIG. 29 is a sectional view illustrating the board of FIG. 28 after an etching process is performed according to an exemplary embodiment.

FIG. 28 is a sectional view illustrating the board 210 after photoresist 241 is applied to the board 210 and a preliminary pattern 242 is formed according to an exemplary embodiment, and FIG. 29 is a sectional view illustrating the board 210 after an etching process is performed according to an exemplary embodiment.

The photoresist 241 is applied to one side of the board 210. Photoresist is also applied to the other side of the board 210. Exposing and developing processes are performed on the photoresist applied to the other side of the board 210 by using a mask, so as to remove parts of the photoresist for forming the preliminary pattern 242 having a shape corresponding to the shape of a pattern to be formed on the board 210.

An etching process is performed by allowing an etchant to flow through slots in the preliminary pattern 242, so as to remove parts 210b of the board 210 for forming a pattern 212 as shown in FIG. 29, thereby forming a circuit layer 210a including the pattern 212 and the bumps 211. The bumps 211 are formed in one piece with the pattern 212 and protrude from one side of the pattern 212. Since the pattern 212 and the bumps 211 of the circuit layer 210a are formed in one piece, circuit boards located at both sides of the circuit layer 210a can be connected without having to form via holes, so that multi-layer circuit boards or chip-mounted circuit board can be easily manufactured.

Figure 30:
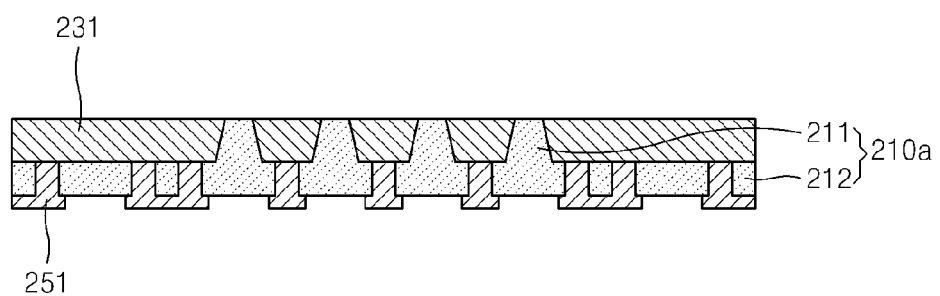
FIG. 30 is a sectional view illustrating the board of FIG. 29 after the photoresist is removed and a dielectric layer is formed according to an exemplary embodiment.

FIG. 30 is a sectional view illustrating the board 210 after the photoresist is removed and a lower dielectric layer 251 is formed according to an exemplary embodiment.

After the photoresist applied to the circuit layer 210a is removed, the lower dielectric layer 251 may be formed on the other side of the circuit layer 210a. Parts of the pattern 212 are exposed through the lower dielectric layer 251.

Figure 31:
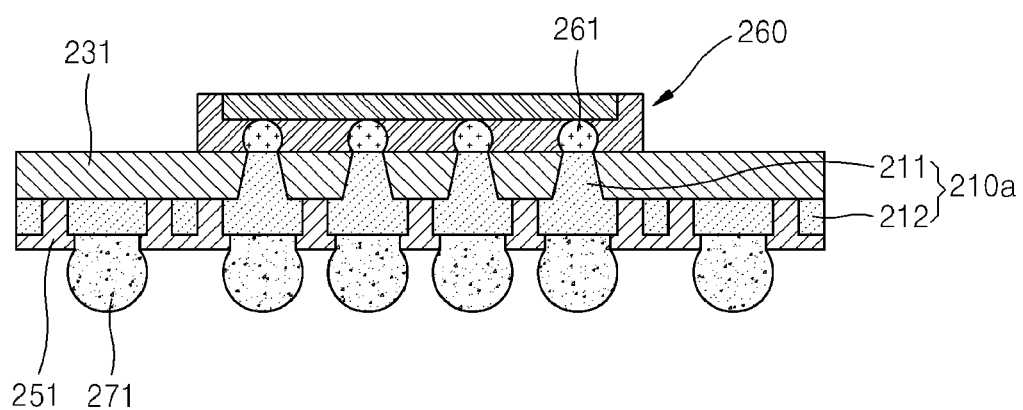
FIG. 31 is a sectional view illustrating an exemplary flip-chip bonding structure including a circuit board illustrated in FIG. 30 according to an exemplary embodiment.

FIG. 31 is a sectional view illustrating an exemplary flip-chip bonding structure using a circuit board illustrated in FIG. 30.

Referring to FIG. 31, a flip chip 260 is mounted on the surfaces of the bumps 211 exposed through the upper side of the circuit board in a state where solder bumps 261 are disposed between the flip chip 260 and the bumps 211. In addition, solder bumps 271 are attached to the pattern 212 which is exposed through the bottom side of the circuit board.

By using the above-described circuit board, flip chip bonding is possible without having to perform a via forming process, and thus the manufacturing costs, manufacturing time, and thickness of the circuit board can be reduced.

As described above, according to the circuit board and the method of manufacturing the circuit board, layers can be connected through bumps without having to perform a drilling process for forming via holes, and thus the manufacturing processes can be simply performed with lower costs and in a shorter time. In addition, since layers can be connected through bumps formed by a half etching process, fine pitch circuits can be formed. Furthermore, since a circuit layer including patterns and bumps that are formed in one piece is used to connect layers while the circuit layer functions as a circuit, a multi-layer circuit board not including a core layer and having a smaller thickness can be manufactured.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A method of manufacturing a circuit board, comprising:
    forming at least one protruded bump on a first side of a conductive board, the bump being made of a portion of the conduction board;
    forming a dielectric layer on the first side of the conductive board where the at least one bump is formed so that the dielectric layer covers the at least one bump; and
    etching a second side of the conductive board so as to remove at least one portion of the conductive board to form a first pattern.

2. The method of claim 1, wherein the forming the at least one bump comprises:
    applying photoresist to the first side of the conductive board;
    exposing and developing the first side of the conductive board, on which the photoresist is applied, to remove at least one portion of the photoresist to form at least one preliminary pattern, corresponding to the at least one bump; and
    half-etching the first side of the conductive board, in a thickness direction, at least one area, where the at least one portion of the photoresist is removed, so that the conductive board at the at least one area is not penetrated through in the thickness direction.

3. The method of claim 1, wherein the forming the at least one bump is performed by pressing the conductive board using a die or a roller having the first pattern corresponding to the at least one bump.

4. The method of claim 1, further comprising:
    removing at least one portion of the dielectric layer to expose the at least one bump;
    forming a seed layer on the dielectric layer so that the seed layer is connected to the at least one bump; and
    forming a plating layer having a second pattern on the seed layer.

5. The method of claim 4, wherein the forming the plating layer comprises:
    forming at least one preliminary pattern on the seed layer by using photoresist;
    forming the plating layer on the seed layer using the preliminary pattern;
    removing the photoresist; and
    removing the seed layer on at least one area where the plating layer is not formed.

6. The method of claim 1, further comprising:
    forming at least one slot on the dielectric layer by removing at least one portion of the dielectric layer through a laser direct ablation method so that the at least one bump is exposed through the at least one slot; and
    forming a circuit layer on the at least one slot of the dielectric layer so that the circuit layer is connected to the bump.

7. The method of claim 6, wherein the forming the circuit layer comprises:
- plating a conductive layer on the dielectric layer where the at least one slot is formed so as to cover the dielectric layer; and
- after the conductive layer is formed, removing a part of the conductive layer located outside the dielectric layer by half-etching the conductive layer in a thickness direction so that at least a portion of an upper surface of the dielectric layer is exposed, and at least a portion of the conductive layer plated inside the at least one slot is not etched,
- wherein the conductive layer from which the part located outside the dielectric layer is removed forms the circuit layer.

8. A method of manufacturing a circuit board, comprising:
- forming first bumps on a first side of a conductive board and second bumps on a second side of the conductive board, the first and second bumps being made of portions of the conductive board;
- forming a first dielectric layer on the first side of the conductive board to cover the first bumps;
- forming first photoresist on the second side of the conductive board;
- forming first preliminary patterns by exposing and developing the first photoresist; and
- etching the second side of the conductive board to remove portions the conductive board to form a first pattern.

9. The method of claim 8, wherein the forming the first bumps and second bumps comprises:
- applying second photoresist to the first and second sides of the conductive board;
- forming second preliminary patterns by exposing and developing the second photoresist; and
- half-etching the first and second sides of the conductive board, in a thickness direction, at areas where the second preliminary patterns are not formed so as to remove portions of the conductive board,
- wherein the conductive board at the areas is not penetrated through in the thickness direction by the half-etching.

10. The method of claim 8, wherein the forming the first and second bumps is performed by pressing the conductive board using a die or a roller having the first pattern corresponding to the first and second bumps.

11. The method of claim 8, further comprising:
- removing the first photoresist from the second side of the conductive board;
- forming a second dielectric layer on the second side of the conductive board to cover the second bumps;
- removing parts of the first and second dielectric layers formed on the first and second sides of the conductive board so as to expose the first and second bumps;
- forming seed layers on the first and second dielectric layers so that the seed layers are connected to the first and second bumps; and
- forming plating layers having second patterns on the seed layers.

12. The method of claim 11, wherein the forming the plating layers comprises:
- forming second preliminary patterns on the seed layers;
- forming the plating layers on the seed layers by using the second preliminary patterns;
- removing the second preliminary patterns; and
- etching the seed layers at areas where the second preliminary patterns are removed.

13. The method of claim 8, further comprising:
- removing the first photoresist from the second side of the conductive board;
- forming a second dielectric layer on the second side of the board to cover the bump;
- removing parts of the first and second dielectric layers formed on the first and second sides of the conductive board by a laser direct ablation method so as to form slots through which the first and second bumps are exposed; and
- forming circuit layers on the dielectric layers so that the circuit layers are connected to the first and second bumps.

14. The method of claim 13, wherein the forming the circuit layers comprises:
- plating conductive layers so as to cover the dielectric layers including the slots;
- after forming the conductive layers, half-etching the conductive layer to remove parts of the conductive layers located outside the first and second dielectric layers,
- wherein the conductive layers from which the parts located outside the dielectric layers are removed form the circuit layers.

15. A method of manufacturing a circuit board, the method comprising:
- etching first and second surfaces of a conductive board so that a plurality of first bumps are formed on a first surface of the conductive board and a plurality of second bumps are formed on a second surface of the conductive board;
- further etching at least one of the first and second surfaces of the conductive board between places where the first bumps or the second bumps are formed so that:
  - a plurality of slots penetrating the conductive board from the first surface to the second surface are formed between the places where the first bumps or the second bumps are formed;
  - at least one of the first bumps and at least one of the second bumps formed between the windows are connected to each other; and
  - the conductive board remaining after the etchings forms a one piece first circuit layer,
- forming dielectric layers on the first and second sides of the conductive board to fill the plurality of slots, and exposing a top surface of the at least one of the first bumps and a top surface of the at least one of the second bumps; and
- forming a second circuit layer on the top surface of the at least one of the first bumps and forming a third circuit layer on the top surface of the at least one of the second bumps, so that the second circuit layer is connected to the third circuit layer through the at least one of the first bumps and the at least one of the second bumps.

* * * * *